United States Patent
Klein et al.

(10) Patent No.: US 6,785,780 B1
(45) Date of Patent: Aug. 31, 2004

(54) DISTRIBUTED PROCESSOR MEMORY MODULE AND METHOD

(75) Inventors: Dean A. Klein, Eagle, ID (US); Graham Kirsch, Tadley (GB)

(73) Assignee: Micron Technology, Inc., Boise, ID (US)

(*) Notice: Subject to any disclaimer, the term of this patent is extended or adjusted under 35 U.S.C. 154(b) by 93 days.

(21) Appl. No.: 09/655,517

(22) Filed: Aug. 31, 2000

(51) Int. Cl.[7] .............................................. G06F 12/00
(52) U.S. Cl. ........................................ 711/148; 711/5
(58) Field of Search ........................... 711/5, 104, 147, 711/148, 153, 170, 173, 202; 707/1

(56) References Cited

U.S. PATENT DOCUMENTS

| | | | |
|---|---|---|---|
| 4,276,594 A | 6/1981 | Morley ....................... 364/200 |
| 4,447,881 A | 5/1984 | Brantingham et al. ...... 364/488 |
| 5,113,500 A | 5/1992 | Talbott et al. ............... 395/325 |
| 5,710,733 A | 1/1998 | Chengson et al. ............ 365/52 |
| 5,842,200 A | * 11/1998 | Agrawal et al. .............. 700/90 |
| 6,011,741 A | 1/2000 | Wallace et al. .............. 365/221 |
| 6,185,704 B1 | * 2/2001 | Pawate et al. ............... 714/719 |
| 6,201,733 B1 | 3/2001 | Hiraki et al. ........... 365/185.08 |
| 6,295,592 B1 | * 9/2001 | Jeddeloh ..................... 711/169 |
| 6,356,497 B1 | * 3/2002 | Puar et al. ............. 365/189.02 |
| 6,363,502 B1 | * 3/2002 | Jeddeloh ....................... 714/52 |
| 6,430,648 B1 | * 8/2002 | Carnevale ....................... 711/5 |

OTHER PUBLICATIONS

Margolus, Norman, "An Embedded DRAM Architecture for Large–Scale Spatial–Lattice Computations", *MIT AI Laboratory*, pp. 149–160, ISCA 2000.

* cited by examiner

Primary Examiner—Matthew Kim
Assistant Examiner—Woo H. Choi
(74) *Attorney, Agent, or Firm*—Dorsey & Whitney LLP

(57) ABSTRACT

A memory module for a computer system is removably coupled to a computer system mother-board having a data bus and an address bus. The memory module includes a memory interface, a program memory coupled to the memory interface, and a plurality of memory/processing units coupled to the memory interface and the program memory. Each of the memory/processing units includes a system memory and a processor coupled to the respective system memory. Instructions for the processors are transferred to the program memory and stored in the program memory responsive to a first set of addresses on the address bus of the mother-board. The processors then execute the instructions from the program memory, and may access the system memory during execution of the instructions. The system memory may also be accessed through the data bus of the mother-board responsive to a second set of addresses on the address bus of the mother-board. At least some to the addresses in the second set are different from the addresses in the first set. As a result, the memory may be used to replace a standard memory module to provide the computer system with enhanced processing capabilities.

51 Claims, 3 Drawing Sheets

DISTRIBUTED PROCESSOR MEMORY MODULE AND METHOD

TECHNICAL FIELD

This invention relates to memory devices, and more particularly to memory modules having on-board processors.

BACKGROUND OF THE INVENTION

A conventional computer system 10 shown in FIG. 1 includes a central processing unit ("CPU") 12, such as a microprocessor, that is coupled to a bus bridge 16, memory controller or the like. The CPU 12 is also typically coupled to a cache memory 18 to allow instructions and data to be more frequently accessed by the CPU 12. The bus bridge 16 allows the CPU 12 to receive program instructions from a system memory 20. The CPU 12 can also write data to and read data from the system memory 20 through the bus bridge 16. The CPU 12 also preferably transfers video data from the system memory 20 to a display system including a graphics processor or graphics accelerator 24, a video RAM 26, and a conventional display 28, such as a cathode ray tube ("CRT"), liquid crystal display ("LCD") or field emission display ("FED"). The graphics accelerator 24 processes graphics data to free up the CPU 12 from performing that function. The graphics accelerator 24 writes video data to and reads video data from the video RAM 26, and generates a video signal that is applied to the display 28. The bus bridge 16 also interfaces the CPU 12 to a peripheral bus 30, such as a peripheral component interconnect ("PCI") bus. The peripheral bus 30 is, in turn, coupled to at least one mass storage device, such as a disk drive 32 and a CD ROM drive 34, and at least one user interface device, such as a keyboard 36 and a pointing device 38. The computer system 10 may, of course, contain a greater or lesser number of components.

As shown in FIG. 2, the system memory 20 is generally in the form of several integrated circuit memory devices 40, such as dynamic random access memories ("DRAMs") and which may be Advanced Technology ("AT") Drams, such as RAMBUS DRAMs ("RDRAMs") or synchronous link DRAMs ("SLDRAMs"), mounted on a printed circuit board 42. The resulting memory module 44 is then removably plugged into a mother-board 46 of a computer system 10 (FIG. 1). The size of the computer system's memory can be increased by simply plugging additional memory modules 44 into the mother-board 46. Memory modules 44 are commercially available in standardized configurations, such as a single in-line memory module ("SIMM") and a double in-line memory module ("DIMM"). The memory modules 44 are electrically coupled to a memory controller 50 or other device (not shown) mounted on the mother-board 46 using standardized memory interfaces. These standardized memory interfaces generally include a data bus, an address bus, and a control/status bus.

Transferring data and instructions to and from the system memory 20 is a frequent event, and it can consume a substantial percentage of the available processing time of the CPU 12. To reduce the processing burden on the CPU 12, direct memory access procedures may be employed in which data and instructions are transferred to and from the system memory 20 by device other than the CPU 12. For example, instructions may be transferred directly from a basic input-output system ("BIOS") read only memory ("ROM") (not shown) or from a disk drive 32 (FIG. 1) for subsequent reading and execution by the CPU 12. Graphics data stored in the system memory 20 may be transferred directly to the graphics accelerator 24 without the use of the CPU 12. Direct memory accesses thus allow the CPU 12 to perform other functions during accesses to the system memory 20. Direct memory access may similarly be used to transfer data to and from the video RAM 26 without using the CPU 12.

Although direct memory access procedures can free-up the CPU 12 to perform other functions during a simple data transfer procedure, there are other memory intensive processing functions occurring in the computer system 10 that cannot be performed easily by devices other than the CPU 12. For example, "data mining" is a procedure by which data stored in the system memory 20 is searched for the presence of predetermined patterns or values of characters. A data mining algorithm causes the CPU 12 to repetitively read data from the system memory 20 and compare the read data to the predetermined data. Since this procedure requires that data not only be transferred from the system memory 20 but also be compared to the predetermined data, the CPU 12 is normally required to perform this procedure. The processing power of the CPU 12 is also required to execute a wide variety of other memory intensive algorithms, such as speech recognition algorithms.

Attempts have been made to free CPUs from executing memory intensive algorithms by placing dedicated processors on memory modules, such as the memory module 44 shown in FIG. 2. An example of a conventional memory module containing on-board processing capability is shown in FIG. 3. The memory module 60 includes several memory devices 62, such as DRAMs, mounted on a printed circuit substrate 64. The module 60 also includes a respective dedicated processor 70 coupled to each memory device 62 though a bus system 72. A single program memory 74 receives and then stores instructions coupled from appropriate circuitry (not shown) on the mother-board 46 FIG. 2) through a program bus 76. The program memory 74 supplies the stored instructions to all of the processors 70. Generally the same or related instructions are supplied to all of the processors 70 so that the processors 70 operate in parallel. The processor 70 is generally a reduced instruction set computer ("RISC"), although more conventional processors may also be used.

In operation, prior to performing a memory intensive function, the module 60 is programmed by supplying the program memory 74 through the program bus 76 with instructions to perform a predetermined algorithm. The processors 70 then fetch the instructions stored in the program memory 74, and perform the corresponding functions. These functions will normally include reading data from the memory devices 62 and writing data to the memory devices 62. Significantly, the CPU 12 of the computer system 10 need not be involved in performing these functions, although the CPU 12 may be involved in initially providing the instructions to the program memory 74. As a result, the CPU 12 is free to perform other functions during these memory intensive operations. The memory module 60, may, of course, be used as a conventional memory module, in which case it interfaces with the mother-board 46 through a conventional bus system 80 including a data bus, address bus, and control/status bus. The bus system 80, as well as the program bus 76, generally interface with the mother-board 46 through an edge connector 88a,b.

The memory module 60 shown in FIG. 3 can be effective in greatly improving the processing power of computer systems 10 performing memory intensive algorithms. Its primary limitation is the requirement that the mother-board 46 be specially adapted to interface with the memory module 60. More specifically, the mother-board 46 must include a bus for interfacing with the program bus 76, as well as appropriate circuitry for supplying the instructions to the bus 76. Different memory modules 60 may, of course, use different processors 70, thereby requiring that the instruction set provided by the mother-board 46 be matched to the processor 70. Additionally, the edge connector 88 is inherently different from a conventional memory a module edge connector because it must include terminals for the processor bus 76. Computer systems 10, and hence mother-boards 46, are available from a wide variety of manufacturers, and so are memory modules. As a result, conventional memory modules 60 that include on-board processors 70 must be specially matched to specific computer systems 10, thus making the use of such memory modules 60 inconvenient and unduly expensive.

It would greatly facilitate the use of memory modules containing processors and make them more marketable if they could electrically and physically interface with conventional computer system mother-boards without any hardware modifications. However, the need to supply the modules with instructions adapted for specific processors makes standardization apparently impractical.

SUMMARY OF THE INVENTION

A method and apparatus for accessing and processing data in a system memory of a computer system. The system memory is mounted on a memory module that is coupled to the computer system through a data bus and an address bus. The memory module also contains a processor and a program memory. Instructions are transferred from the data bus to the program memory responsive to a first set of addresses on the address bus. The processor may then execute the stored instructions from the program memory. The system memory may also be accessed by the computer system through the data bus responsive to a second set of addresses on the address bus, at least some of which are different from the addresses in the first set. As a result, the memory module can interface with the computer system in the same manner as a conventional memory model not containing any on-board processing capability.

DETAILED DESCRIPTION OF THE INVENTION

Figure 2:
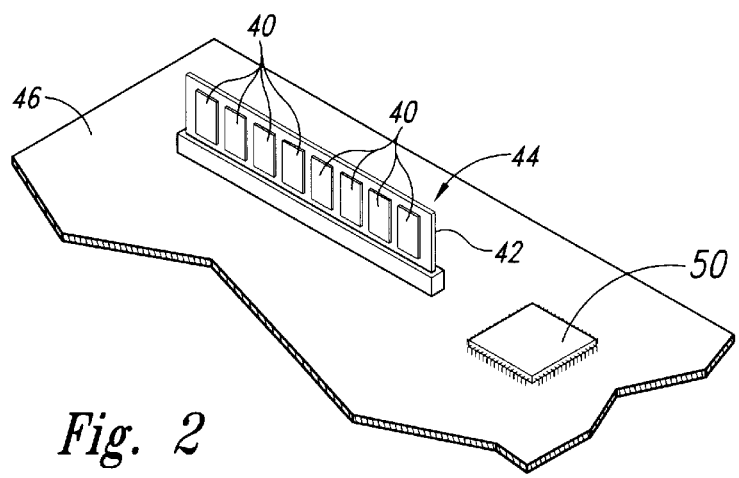
FIG. 2 is a schematic drawing of a conventional memory module that may be used as a system memory in the computer system of FIG. 1.
Figure 4:
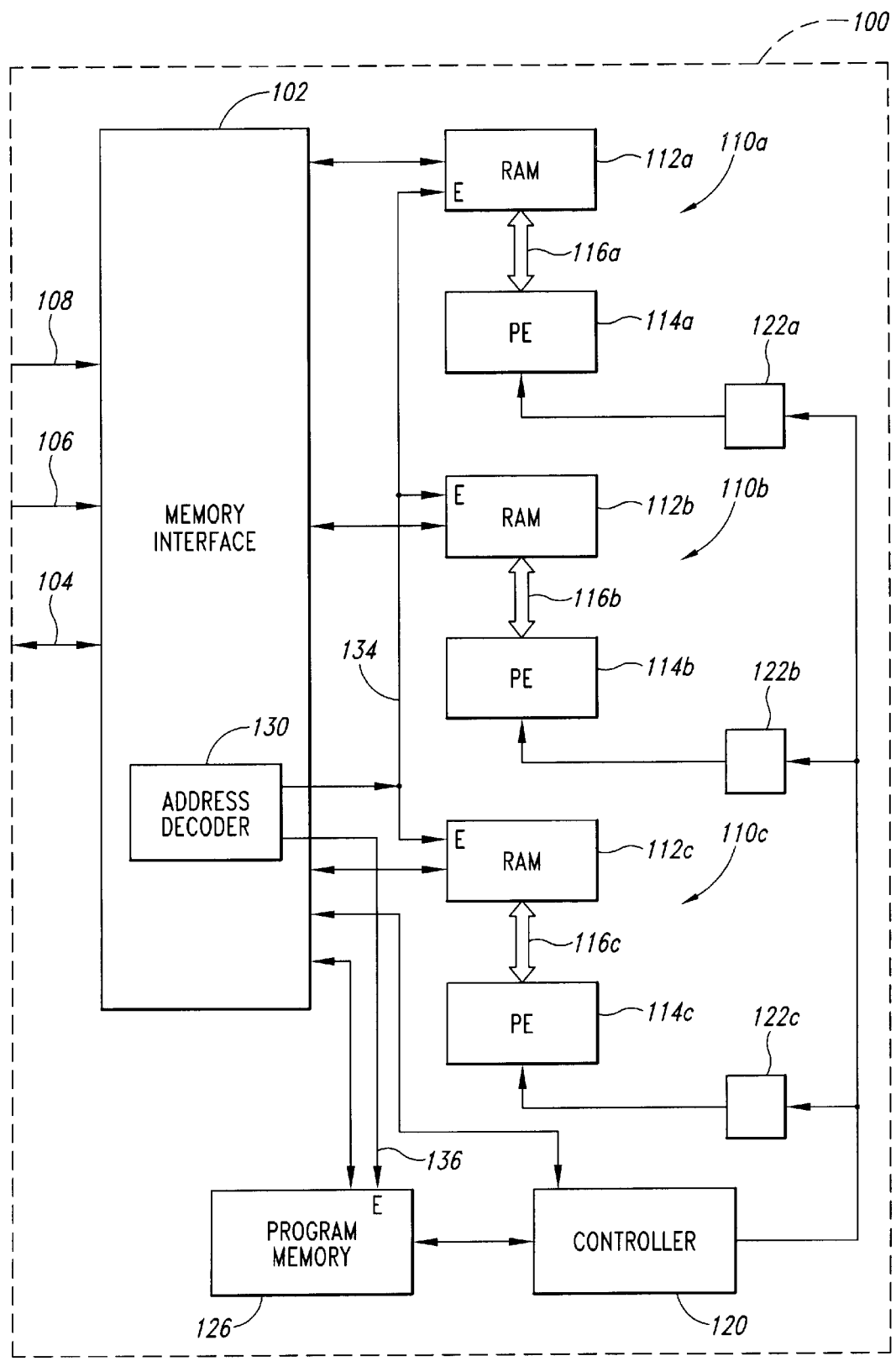
FIG. 4 is a block diagram of a memory module having on-board processing capabilities in accordance with one embodiment of the invention.

One embodiment of a memory module 100 in accordance the invention is illustrated in FIG. 4. The memory module 100 includes a memory interface 102 that includes a data bus 104, an address bus 106 and a control bus 108. The memory interface 102 includes conventional buffers, timing circuitry and possibly address decoders (not shown), as explained in greater detail below, to route data to and from the memory module 100 and to route addresses and control signals to the memory module 100. Significantly, the buses 104–108 are identical to the buses of the conventional memory module 44 (FIG. 2) not having on-board processing capabilities. Therefore, the memory module 100 is plug compatible with the memory module 44 and, as a result, can be universally installed in the mother-board 46 of conventional computer systems 10 without the need for any hardware modifications.

The memory interface 102 is coupled to a plurality of memory/processing units 110, three of which 110a–c are included in the memory module 100 of FIG. 4. However, it will be understood that a greater or lesser number of memory/processing units 110 may be contained within a memory module 100. Each of the memory/processing units 110 includes a RAM 112 coupled to a processing element ("PE") 114 through a bus system 116 that includes a data bus. The RAM 112 may be essentially the same as the memory 62 shown in FIG. 3, and the PE 114 may be essentially the same as the processor 70 shown in FIG. 3. The data bus in the bus system 116 coupling each of the RAMs 112a–c to its respective PE 114a–c is preferably relatively wide, i.e., substantially wider than the number of bits of the data bus 104. In fact, the data bus in the bus system 116 may have the same number of bits as the number of columns in the memory arrays of the RAM 112 so that data may be coupled between the RAMs 112a–c and their respective PEs 114a–c one row at a time. The RAMs 112a–c and their respective PEs 114a–c may be fabricated on the same integrated circuit chip or on different integrated circuit chips. Additionally, all of the RAMs 112a–c may be fabricated on the same integrated circuit chip, and all of the PEs 114a–c may be fabricated on the same integrated circuit chip, which may be the same or a different integrated circuit chip on which all of the RAMs I 12a–c are fabricated.

Figure 3:
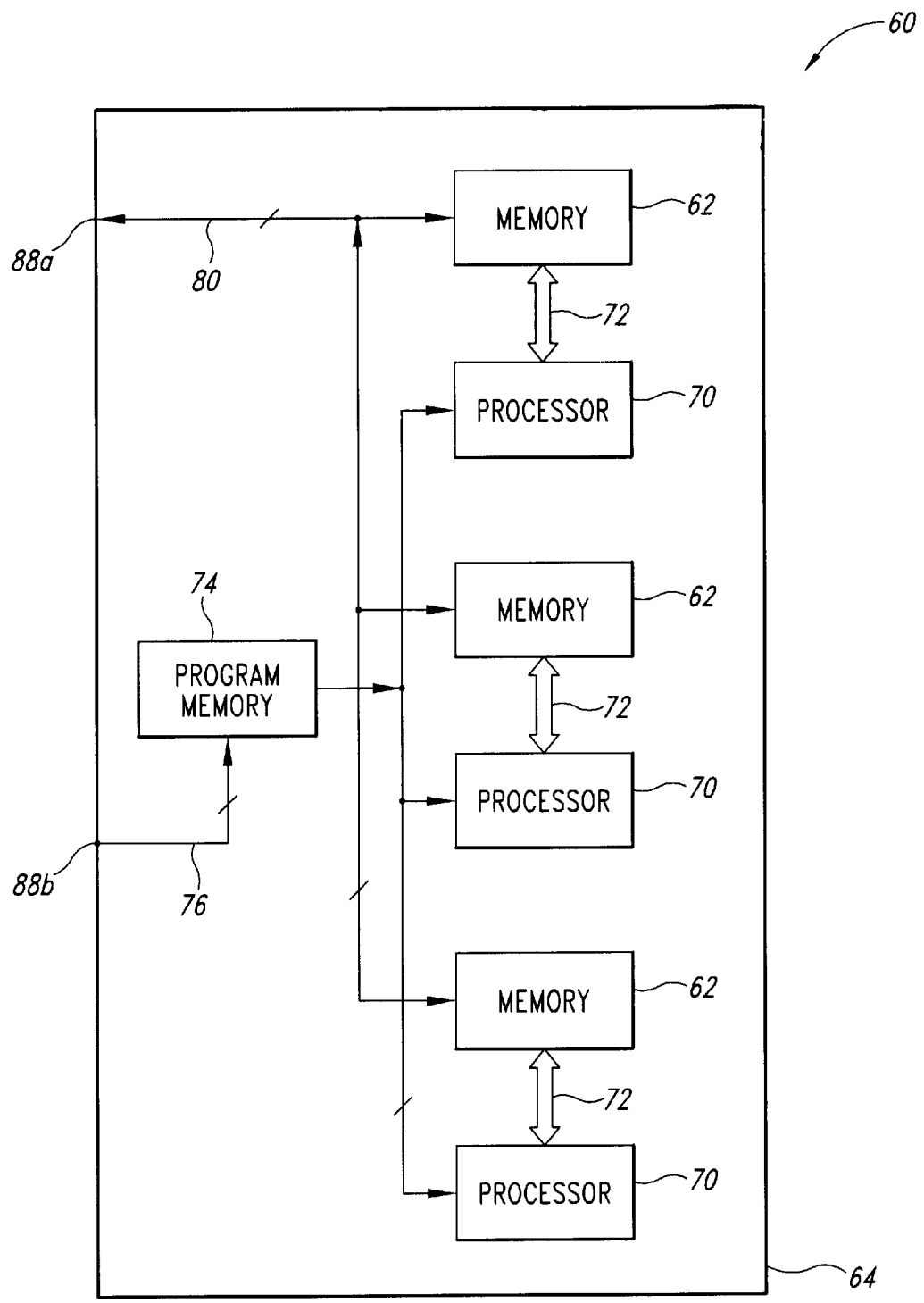
FIG. 3 is a block diagram of a conventional memory module having on-board processing capabilities.

Unlike the processing element array of FIG. 3, the PEs 114 do not receive their instructions through a dedicated program bus 76 (FIG. 3) from the CPU 12 (FIG. 1) or another device external to the memory module 100. Instead, as explained in greater detail below, the program instructions for the PEs 114 are routed through the data bus 104. More specifically, the PEs 114 receive their instructions from a controller 120 through respective buffers 122 a–c . Generally, although not necessarily, the PEs 1 14a–c operate in parallel with each other and thus receive identical instructions from the controller 120.

Prior to using the module 100, the instructions for the PEs 114a–c are written to the program memory 126 from the memory interface 102. The memory interface 102 is structured to map the address space of the computer system 10 either to the RAMs 112a–c or to the program memory 126. Although a variety of circuitry may be used to perform the memory mapping function, an address decoder 130 in the memory interface 102 may be used. The address decoder 130 receives at least one high order bit on the address bus 106. The address decoder 130 generates a first memory select signal on a line 134 to enable the RAMs 112 responsive to decoding at least one high order address bit corresponding to a first set of addresses. Alternatively, the address decoder 130 generates a second memory select signal on a line 136 to enable the program memory 126 responsive to decoding at least one high order address bit corresponding to a second set of addresses. A plurality of low order bits are coupled to both the program memory 126 and the RAMs 112. At least some, and preferably all, of the addresses in the second set of addresses are different from the addresses in the first set of addresses.

In operation, if an address on the address bus 106 is in the address space of the RAMs 112a–c , data on the data bus 104 are written to the RAMs 112a–c . Alternatively, if an address on the address bus 106 is in the address space of the program memory 126, data on the data bus 104 are written to the program memory 126. For example, if the RAMs 112*a–c* comprise 32 MB of memory, the memory module 100 may occupy 64 MB of address space in the memory map of the computer system 10 in which the memory module 100 is installed. When the CPU 12 (FIG. 1) accesses an address within the first 32 MB of the address space, the RAMs 112*a–c* are accessed. The memory module 100 can therefore operate as a conventional memory module without on-board processing capability. Alternatively, when the CPU 12 accesses an address within the second 32 MB of the address space, the program memory 126 is accessed. The instructions written to the program memory 126 then allow the PEs 114*a–c* to perform specialized processing functions corresponding to the instructions, thereby allowing the memory module 100 to operate with on-board processing capability. For example, the instructions written to the program memory 126 may implement a conventional data mining algorithm or a conventional voice recognition algorithm. Further, although the PEs 114*a–c* may be implemented using a variety of conventional or hereinafter developed processing devices, they are preferably conventional reduced instruction set computers ("RISC") processors that operate according to a relatively small instruction set.

Figure 1:
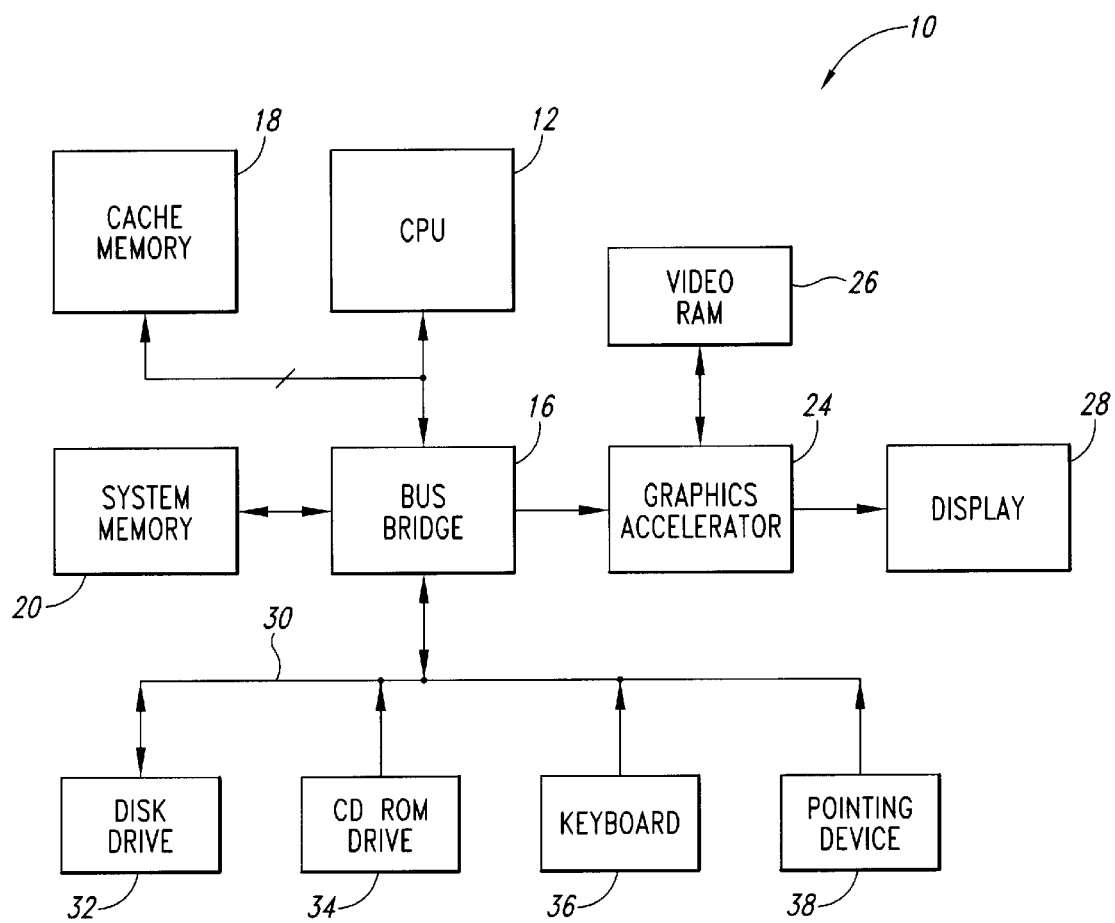
FIG. 1 is a block diagram of a conventional computer system having a system memory.

During the operation of the memory module 100 in the on-board processing mode, the PEs 114*a–c* will sometimes change the contents of the RAMs 112*a–c*. As a result, if the computer system 10 in which the memory module 100 is installed includes a cache memory 18 (FIG. 1), some means must be provided to ensure cache coherency. However, cache coherency can be provided using conventional techniques, such as those used to ensure cache coherency in a computer system 10 having a graphics accelerator 24, as shown in FIG. 1. In particular, the system controller 120 may snoop the processor caches to flush given address ranges. Alternatively, a block of addresses in the address space of the RAMs 112*a–c* may be designated as non-cacheable, thus avoiding the need for the computer system 10 to "snoop" those addresses.

It is thus seen that the memory module 100 in accordance with one embodiment of the invention is plug compatible with conventional memory modules and may thus be used with virtually any computer system without the need for hardware modifications. Instead, only software modifications may be required. As a result, conventional computer systems can easily be provided with on-board memory processing capabilities.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory module comprising:
   a memory interface having a data bus, an address bus, and a control bus adapted to interface with a computer system data bus, a computer system address bus and a computer system control bus, the system data bus having a first data width;
   a program memory coupled to the data bus and address bus of the memory interface, the program memory being structured to store data representative of instructions on the data bus responsive to a first set of addresses on the computer system address bus;
   a program memory controller coupled to the program memory and structured to transfer instructions from the program memory; and
   a plurality of memory/processing units each of which includes a processor coupled to a system memory via a memory/processing data bus having a second data width greater than the first data width, the processor being coupled to the controller to have access through the controller to instructions stored in the program memory and being further coupled to the system memory to allow the processor to access the system memory, the system memory further being coupled to the computer system data bus and the computer system address bus to allow the system memory to be accessed through the computer system data bus and the computer system address bus responsive to a second set of addresses on the computer system address bus, at least some of the addresses in the second set being different from the addresses in the first set.

2. The memory module of claim 1 wherein the system memory comprises a dynamic random access memory ("DRAM").

3. The memory module of claim 3 wherein the dynamic random access memory comprises an Advanced Technology ("AT") DRAM.

4. The memory module of claim 3 wherein the AT dynamic random access memory comprises a synchronous link DRAM. ("SLDRAM").

5. The memory module of claim 1 wherein the program memory comprises a dynamic random access memory ("DRAM").

6. The memory module of claim 5 wherein the dynamic random access memory comprises an Advanced Technology ("AT") DRAM.

7. The memory module of claim 6 wherein the AT dynamic random access memory comprises a synchronous link DRAM. ("SLDRAM").

8. The memory module of claim 1 wherein the second data width of the memory/processing data bus is a multiple of the first data width of the data bus of the memory interface.

9. The memory module of claim 1 wherein the computer system address bus includes at least one high order bit and a plurality of low order bits, the at least one high order bit having a logic level that distinguishes the first set of addresses from the second set of addresses, and wherein the memory interface includes an address decoder that is coupled to receive and decode the at least one high order bit, the address decoder being structured to generate a first memory select signal to enable the program memory responsive to logic levels of the at least one high order address bit corresponding to the first set of addresses, the address decoder being structured to generate a second memory select signal to enable the system memory in each memory/processing unit responsive to logic levels of the at least one high order address bit corresponding to the second set of addresses.

10. The memory module of claim 9 wherein the plurality of low order bits are coupled to both the program memory and the system memory in each memory/processing unit.

11. The memory module of claim 1 wherein the program memory contains instructions corresponding to a data mining algorithm.

12. The memory module of claim 1 wherein the program memory contains instructions corresponding to a speech recognition algorithm.

13. A memory module for use in a computer system, the memory module comprising:

a substrate adapted for coupling to the computer system through a computer system data bus and a computer system address bus, the system data bus having a first data width;

a program memory coupled to the computer system data bus and the computer system address bus, the program memory being structured to store instructions on the data bus responsive to a first set of addresses on the computer system address bus;

a system memory mounted on the substrate and coupled to the computer system data buts and the computer system address bus, the system memory being structured to transfer data to and from the computer system data bus responsive to a second set of addresses on the computer system address bus, at least some of the addresses in the second set being different from the addresses in the first set;

a program memory controller coupled to the program memory to transfer instructions from the program memory; and a plurality of processors coupled to the system memory through a processor/system memory data bus having a second data width grater than the first data width and further coupled to the program memory controller to have access through the program memory controller to instructions stored in the program memory, each processor being structured to execute instructions from the program memory and, when executing the instructions, access the system memory through the processor/ system memory data bus.

14. The memory module of claim 13 further comprising a memory interface having a data bus and an address bus adapted to interface with the computer system data bus and the computer system address bus, the memory interface being structured to enable either the program memory or the system memory responsive to addresses on the computer system address bus in the first and second sets, respectively.

15. The memory module of claim 13 wherein the system memory comprises a dynamic random access memory ("DRAM").

16. The memory module of claim 15 wherein the dynamic random access memory comprises an Advanced Technology ("AT") DRAM.

17. The memory module of claim 16 wherein the AT dynamic random access memory comprises a synchronous link DRAM. ("SLDRAM").

18. The memory module of claim 13 wherein the program memory comprises a dynamic random access memory ("DRAM").

19. The memory module of claim 18 wherein the dynamic random access memory comprises an Advanced Technology ("AT") DRAM.

20. The memory module of claim 19 wherein the AT dynamic random access memory comprises a synchronous link DRAM. ("SLDRAM").

21. The memory module of claim 13 wherein the processor/system memory data bus comprises an internal data bus, and wherein the second data width is a multiple of the first data width of the computer system data bus.

22. The memory module of claim 13 wherein the computer system address bus includes at least one high order bit and a plurality of low order bits, the at least one high order bit having a logic level that distinguishes the first set of addresses from the second set of addresses, and wherein the memory module further includes an address decoder that is coupled to receive and decode the at least one high order bit, the address decoder being structured to generate a first memory select signal to enable the program memory responsive to logic levels of the at least one high order address bit corresponding to the first set of addresses, the address decoder being structured to generate a second memory select signal to enable the system memory responsive to logic levels of the at least one high order address bit corresponding to the second set of addresses.

23. The memory module of claim 22 wherein the plurality of low order bits are coupled to both the program memory and the system memory.

24. A computer system, comprising:

a central processing unit;

a display system;

a peripheral bus;

at least one mass storage device coupled to the peripheral bus;

at least one user interface device coupled to the peripheral bus;

a bus bridge coupled to the central processing unit and the peripheral bus, the bus bridge being structured to allow communication between the central processing unit and the at least one mass storage device, the at least one use interface device and the display system; and a memory module coupled to the central processing unit, the memory module comprising:

a memory interface adapted to interface with the central processing unit through the bus bridge and having a data bus having a first data width, the memory interface coupling data to and from the bus bridge and coupling addresses from the bus bridge;

a program memory coupled to the memory interface, the program memory being structured to store data representative of instructions responsive to a first set of addresses from the bus bridge;

a program memory controller coupled to the program memory and structured to transfer instructions from the program memory; and a plurality of memory/processing units, each of which includes a processor coupled to a system memory through a memory/processing data bus having a second data width greater than the first data width, the processor being coupled to the program memory controller to have access through the program memory controller to instructions stored in the program memory and being further coupled to the system memory to allow the processor to access the system memory, the system memory further being coupled to transfer data to and from the bus bridge and being coupled to receive addresses from the bus bridge, the system memory being accessed through the bus bridge responsive to a second set of addresses from the bus bridge, at least some of the addresses in the second set being different from the addresses in the first set.

25. The computer system of claim 24 wherein the system memory in each memory/processing unit comprises a dynamic random access memory ("DRAM").

26. The memory module of claim 25 wherein the dynamic random access memory comprises an Advanced Technology ("AT") DRAM.

27. The computer system of claim 26 wherein the AT dynamic random access memory comprises a synchronous link DRAM. ("SLDRAM").

28. The computer system of claim 24 wherein the program memory comprises a dynamic random access memory ("DRAM").

29. The memory module of claim 28 wherein the dynamic random access memory comprises an Advanced Technology ("AT") DRAM.

30. The computer system of claim 29 wherein the AT dynamic random access memory comprises a synchronous link DRAM. ("SLDRAM").

31. The computer system of claim 24 wherein the second data width of the memory/processing data bus is a multiple of the first data width of the data bus of the memory interface.

32. The computer system of claim 24 wherein the addresses received from the bus bridge includes at least one high order bit and a plurality of low order bits, the at least one high order bit having a logic level that distinguishes the first set of addresses from the second set of addresses, and wherein the memory interface includes an address decoder that is coupled to receive and decode the at least one high order bit, the address decoder being structured to generate a first memory select signal to enable the program memory responsive to logic levels of the at least one high order address bit corresponding to the first set of addresses, the address decoder being structured to generate a second memory select signal to enable the system memory in each memory/processing unit responsive to logic levels of the at least one high order address bit corresponding to the second set of addresses.

33. The computer system of claim 32 wherein the plurality of low order bits are coupled to both the program memory and the system memory in each memory/processing unit.

34. The computer system of claim 24 wherein the program memory contains instructions corresponding to a data mining algorithm.

35. The computer system of claim 24 wherein the program memory contains instructions corresponding to a speech recognition algorithm.

36. A method of improving the capabilities of a computer system having a circuit board containing at least one memory module removably mounted on the circuit board, the memory module communicating with the circuit board through a data bus having a first data width and an address bus, the method comprising:
  removing the at least one removable memory module from the circuit board;
  installing a replacement memory module on the circuit board, the replacement memory module including a program memory, a program memory controller coupled to the program memory, and a plurality of memory/processing units, each of which includes a processor coupled to a system memory through a memory/processing data bus having a second data width greater than the first data width, the processor being coupled to the program memory controller to have access through the program memory controller to instructions stored in the program memory and being further coupled to the system memory to allow the processor to access the system memory via the memory/processing data bus, the system memory further being coupled to transfer data to and from the data bus of the circuit board and being coupled to receive addresses from the address bus of the circuit board;
  storing a processing algorithm in the computer system;
  transferring instructions corresponding to the processing algorithm to the program memory by addressing the programming memory using the first set of addresses;
  transferring under the control of the program memory controller the instructions stored in the program memory to the processor for execution of the processing algorithm; and
  accessing the system memory through the circuit board responsive to a second set of addresses from the address bus of the circuit board, at least some of the addresses in the second set being different from the addresses in the first set.

37. The method of claim 36 wherein the memory in each of the memory processing units comprise a dynamic random access memory ("DRAM").

38. The method of claim 36 wherein the second data width of the memory/processing data bus is a multiple of the first data width of the data bus of the memory interface.

39. The method of claim 36 wherein the addresses on the address bus of the circuit board include at least one high order bit and a plurality of low order bits, the at least one high order bit having a logic level that distinguishes the first set of addresses from the second set of addresses, and wherein the acts of addressing the program memory using the first set of addresses and accessing the system memory responsive to a second set of addresses comprise:
  decoding the at least one high order bit of the addresses on the address bus of the circuit board;
  generating a first memory select signal to enable the program memory responsive to logic levels of the at least one high order address bit corresponding to the first set of addresses; and
  generating a second memory select signal to enable the system memory in each memory/processing unit responsive to logic levels of the at least one high order address bit corresponding to the second set of addresses.

40. The method of claim 39 wherein the acts of addressing the program memory using the first set of addresses and accessing the system memory responsive to a second set of addresses further comprise coupling the plurality of low order bits to both the program memory and the system memory in each memory/processing unit.

41. The method of claim 36 wherein the act of storing a processing algorithm in the computer system comprises of storing a data mining algorithm in the computer system.

42. The method of claim 36 wherein the act of storing a processing algorithm in the computer system comprises of storing a speech recognition algorithm in the computer system.

43. A method of accessing and processing data in a system memory of a computer system, the system memory being mounted on a memory module that is coupled to the computer system through a data bus having a first data width and an address bus, the method comprising:
  mounting a program memory on the memory module;
  mounting a program memory controller coupled to the program memory on the memory module;
  mounting a plurality of processors on the memory module and coupling each processor to the system memory through a processor/system memory data bus having a second data width greater than the first data width and further coupling the processors to the program memory controller;
  transferring instructions from the data bus to the program memory responsive to a first set of addresses on the address bus;
  providing access to the instructions stored in the program memory through the program memory controller;
  allowing the processor to execute the stored instructions; and transferring data between the data bus and the system memory responsive to a second set of addresses on the address bus, at least some of the addresses in the second set being different from the addresses in the first set.

44. The method of claim 43 wherein the second data width of the processor/system memory data bus coupling the processor to the system memory is a multiple of the first data width of the data bus coupling the memory module to the computer system.

45. The method of claim 43 wherein the acts of transferring instructions from the data bus to the program memory responsive to a first set of addresses and transferring data between the data bus and the system memory responsive to a second set of addresses comprise:

decoding the at least one high order bit of the addresses on the address bus of the computer system;

generating a first memory select signal to enable the program memory responsive to logic levels of the at least one high order address bit corresponding to the first set of addresses; and generating a second memory select signal to enable the system memory responsive to logic levels of the at least one high order address bit corresponding to the second set of addresses.

46. The method of claim 43 wherein the system memory comprises a plurality of memory devices and the processor comprises a corresponding plurality of processing units coupled to a respective memory device, and wherein the act of allowing the processor to execute the stored instructions comprises transferring through the program memory controller the instructions from the program memory to each of the processor units in parallel.

47. The method of claim 43 wherein the system memory comprises a dynamic random access memory ("DRAM").

48. The method of claim 47 wherein the DRAM comprises an Advanced Technology ("AT") DRAM.

49. The method of claim 48 wherein the AT DRAM comprises a synchronous link DRAM ("SLDRAM").

50. The method of claim 43 wherein the program memory contains instructions corresponding to a data mining algorithm.

51. The method of claim 43 wherein the program memory contains instructions corresponding to a speech recognition algorithm.

* * * * *